United States Patent
Kashiwaya

(10) Patent No.: US 10,656,186 B2
(45) Date of Patent: May 19, 2020

(54) HEAT-RESISTANT DEVICE FOR CURRENT DETECTION

(71) Applicant: NGK INSULATORS, LTD., Nagoya-Shi (JP)

(72) Inventor: Toshikatsu Kashiwaya, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 97 days.

(21) Appl. No.: 15/815,933

(22) Filed: Nov. 17, 2017

(65) Prior Publication Data

US 2018/0172738 A1      Jun. 21, 2018

(30) Foreign Application Priority Data

Dec. 21, 2016   (JP) .................................. 2016-248444

(51) Int. Cl.
*G01R 15/18*  (2006.01)
*G01R 19/00*  (2006.01)
(Continued)

(52) U.S. Cl.
CPC ......... *G01R 15/181* (2013.01); *G01R 31/003* (2013.01); *G01R 19/0092* (2013.01); *G01R 31/2884* (2013.01)

(58) Field of Classification Search
CPC ................ G01R 15/181; G01R 31/003; G01R 19/0092; G01R 31/2884
See application file for complete search history.

(56) References Cited

U.S. PATENT DOCUMENTS 7,196,607 B2   3/2007   Pleskach et al.
8,179,122 B2 * 5/2012   Ibuki .................... G01R 15/181
                                                              324/117 H
(Continued)

FOREIGN PATENT DOCUMENTS

GB    2 342 783 A    4/2000
JP    S61-202078 U   12/1986
(Continued)

OTHER PUBLICATIONS

Japanese Office Action (with English translation), Japanese Application No. 2016-248444, dated Feb. 18, 2020.

*Primary Examiner* — Patrick Assouad
*Assistant Examiner* — Feba Pothen
(74) *Attorney, Agent, or Firm* — Burr & Brown, PLLC

(57) ABSTRACT

A heat-resistant device for current detection may include a heat-resistant substrate including a ceramic material; a group of power wirings embedded in the heat-resistant substrate; and a coil structure. The coil structure may include a coil wiring in which coil units each including or corresponding to one turn of the coil wiring are arranged in a circumferential direction around the group of power wirings. The coil unit may include: a first conductor; a second conductor; a first connection wiring; and a second connection wiring which may be embedded in the heat-resistant substrate. At least the first conductor and the second conductor may not be exposed outside of the heat-resistant substrate. The respective first conductors may be spaced by the substantially same minimum distance from an outer circumferential line surrounding the group of power wirings in a plane orthogonal to the extending direction of the group of power wirings.

12 Claims, 10 Drawing Sheets

(51) Int. Cl.
*G01R 31/00* (2006.01)
*G01R 31/28* (2006.01)

(56) References Cited

U.S. PATENT DOCUMENTS

| | | | |
|---|---|---|---|
| 8,958,215 B2 | 2/2015 | Hirai et al. | |
| 2005/0212642 A1* | 9/2005 | Pleskach | H01F 17/0033 336/200 |
| 2006/0176139 A1 | 8/2006 | Pleskach et al. | |
| 2007/0152651 A1* | 7/2007 | Shiokawa | G01R 15/181 324/76.11 |

FOREIGN PATENT DOCUMENTS

| | | |
|---|---|---|
| JP | 2000-228323 A1 | 8/2000 |
| JP | 2008-530799 A | 8/2008 |
| JP | 2011-035414 A1 | 2/2011 |
| JP | 2017-152528 A | 8/2017 |
| WO | 2012/157373 A1 | 11/2012 |

\* cited by examiner

[FIG. 1]
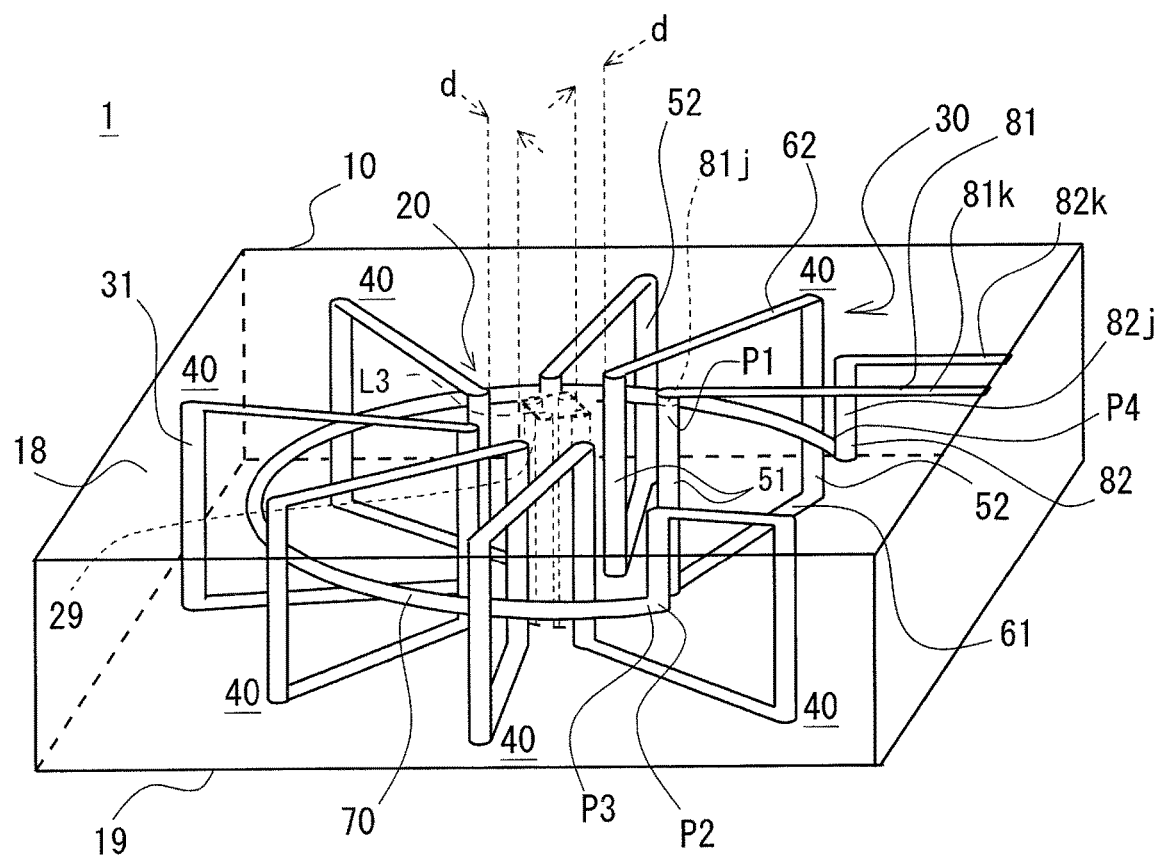

[FIG. 2]
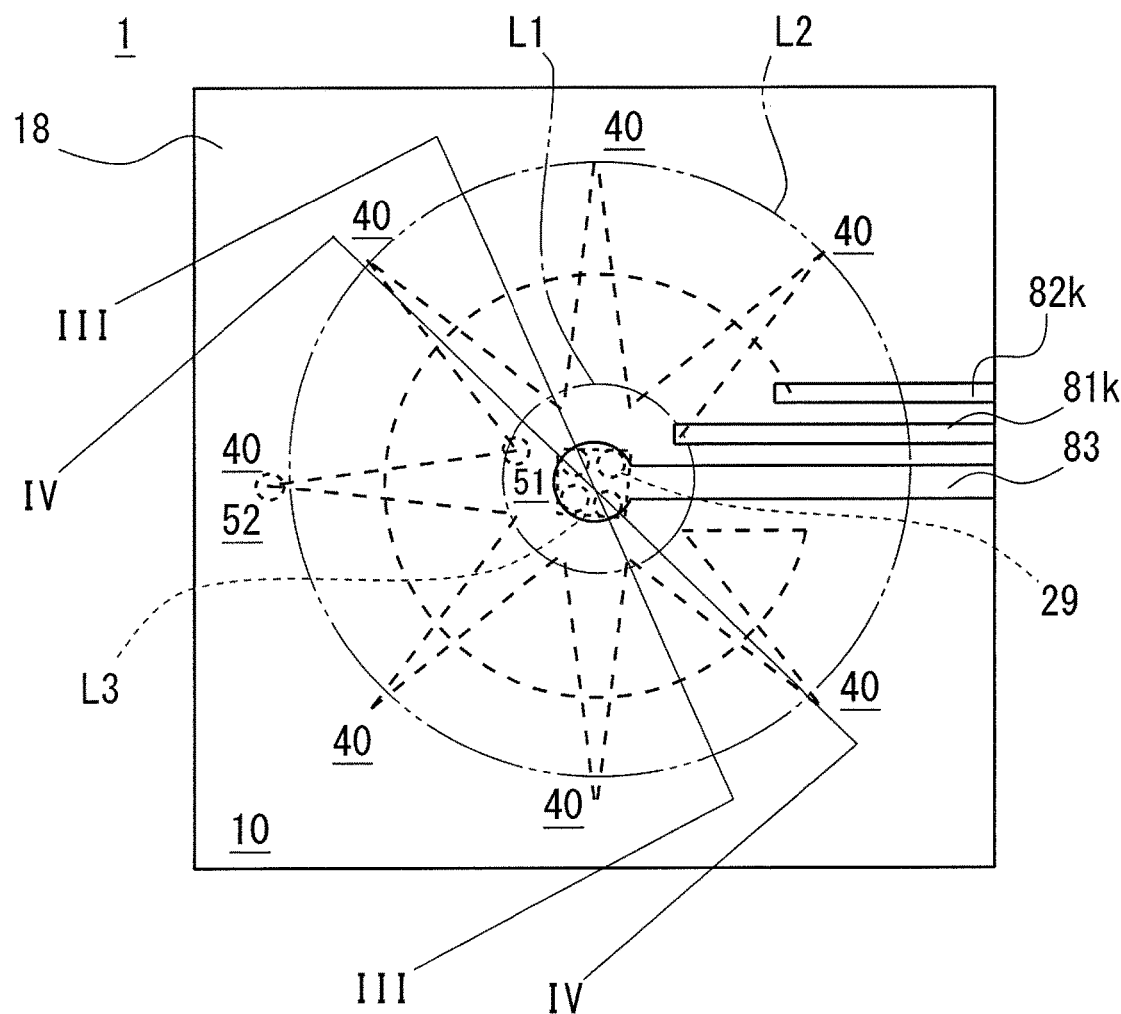

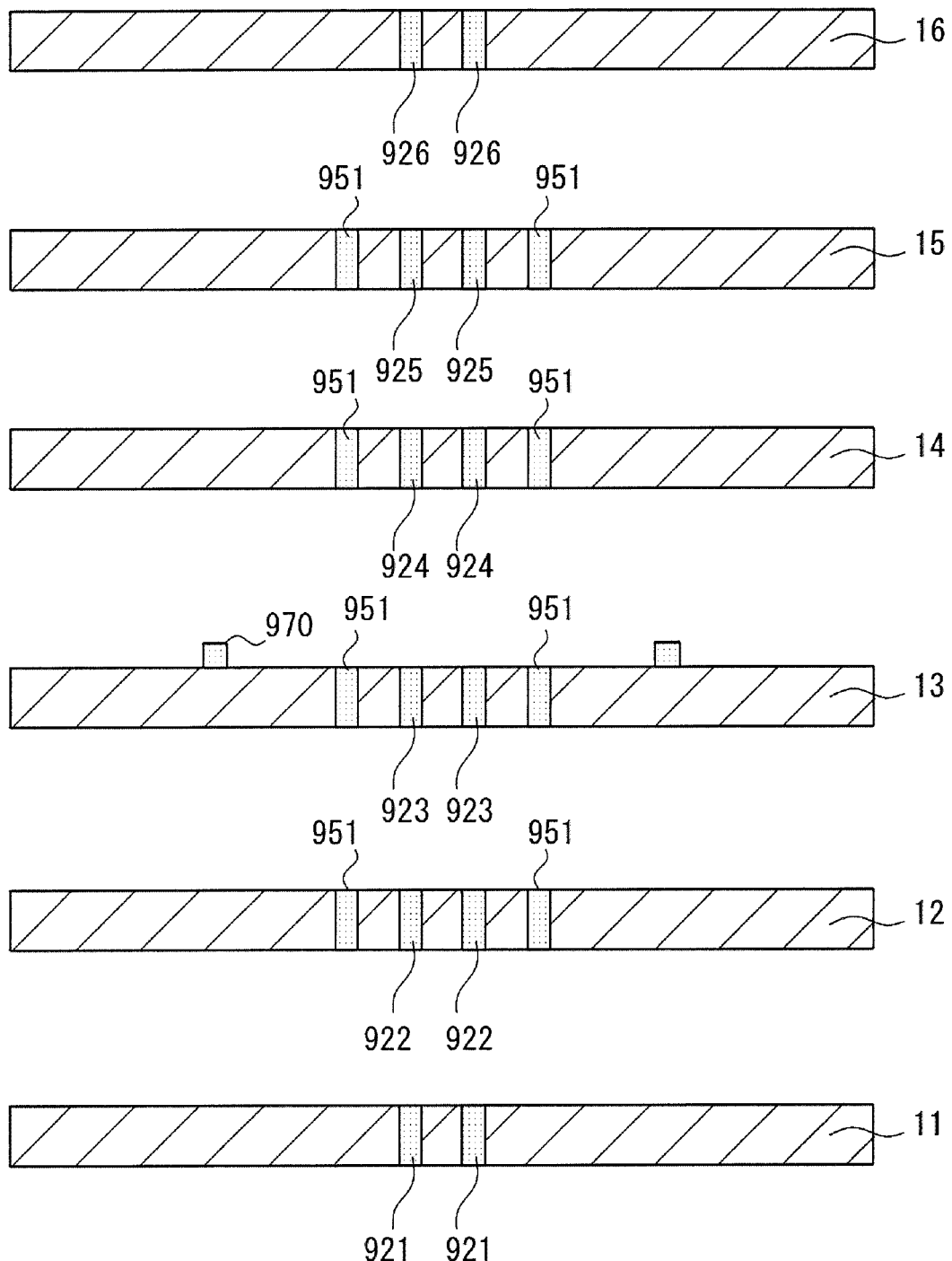
[FIG. 3]

[FIG. 4]
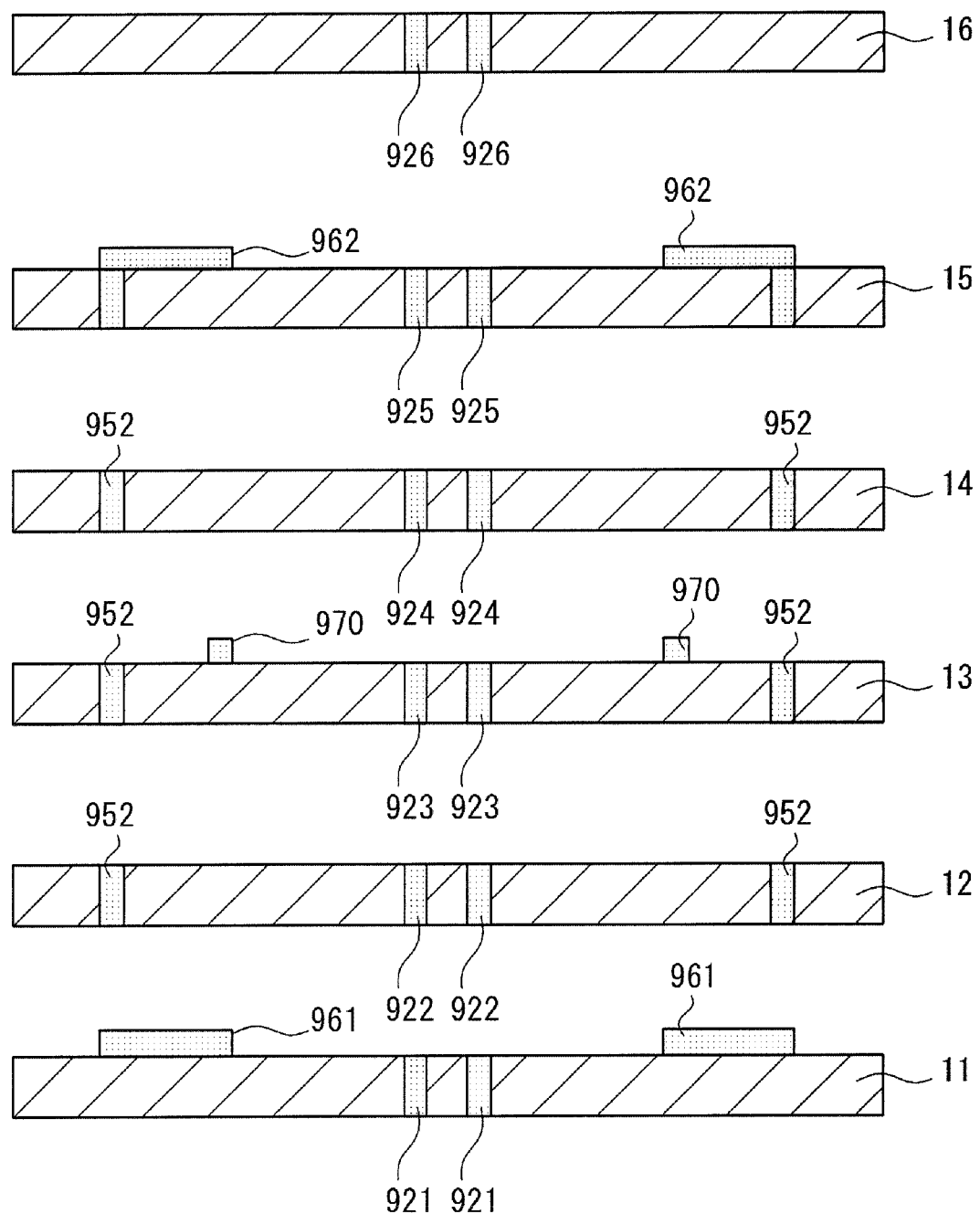

[FIG. 5]
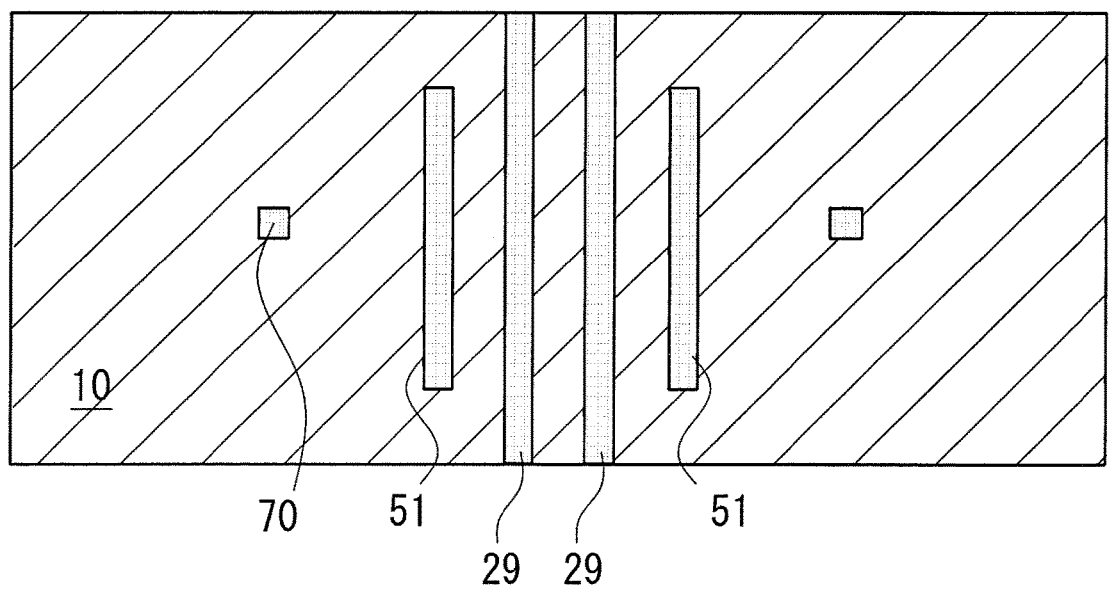

[FIG. 6]
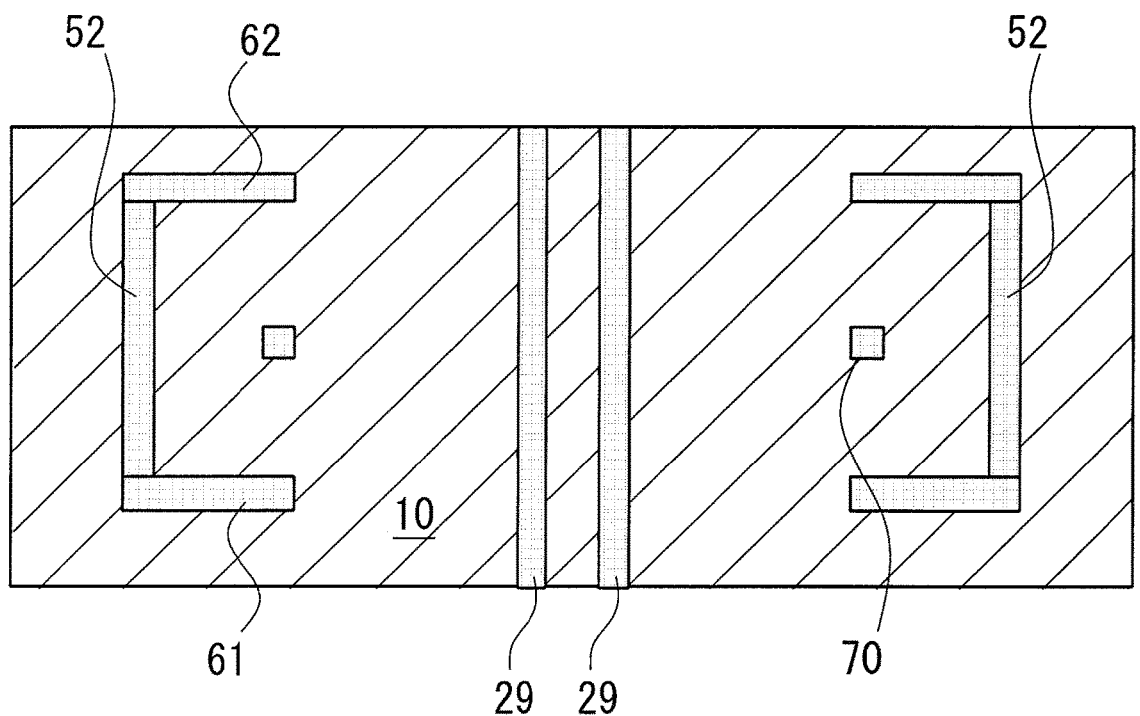

[FIG. 7]
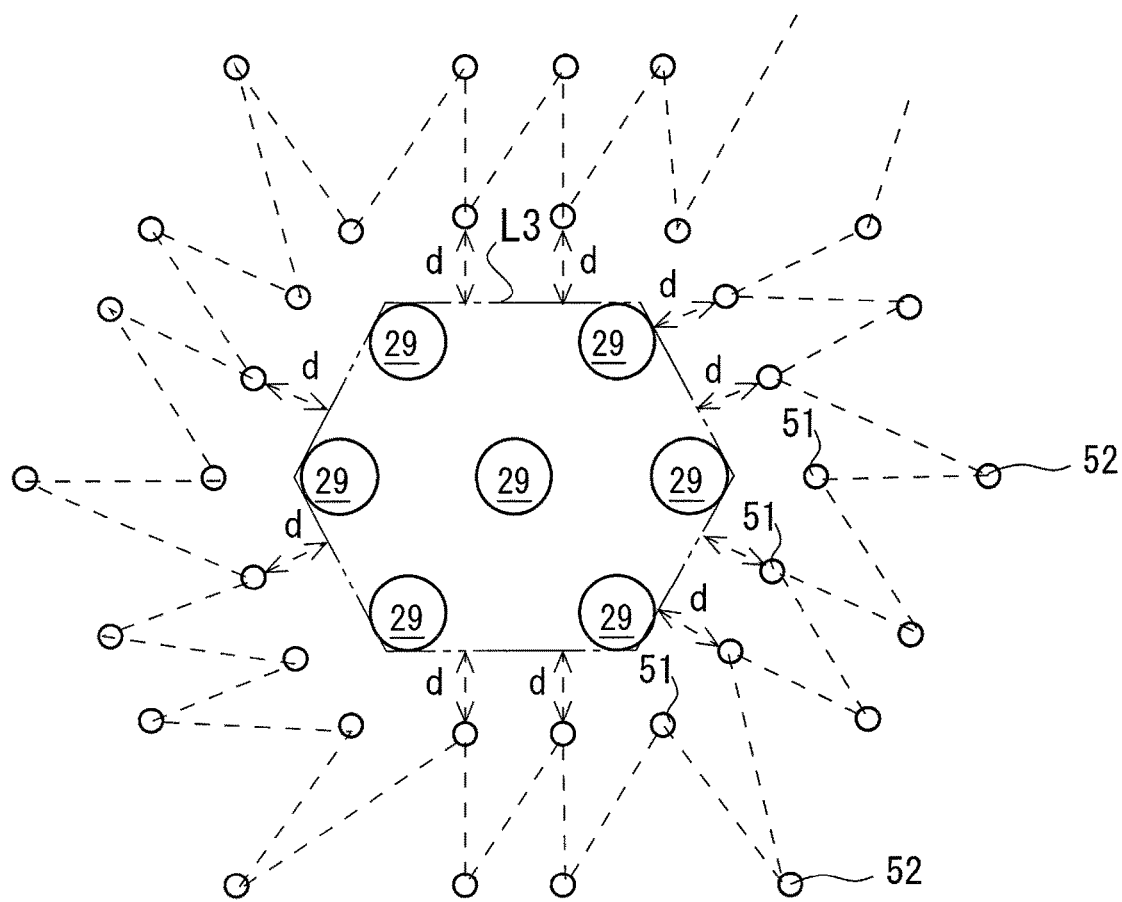

[FIG. 8]
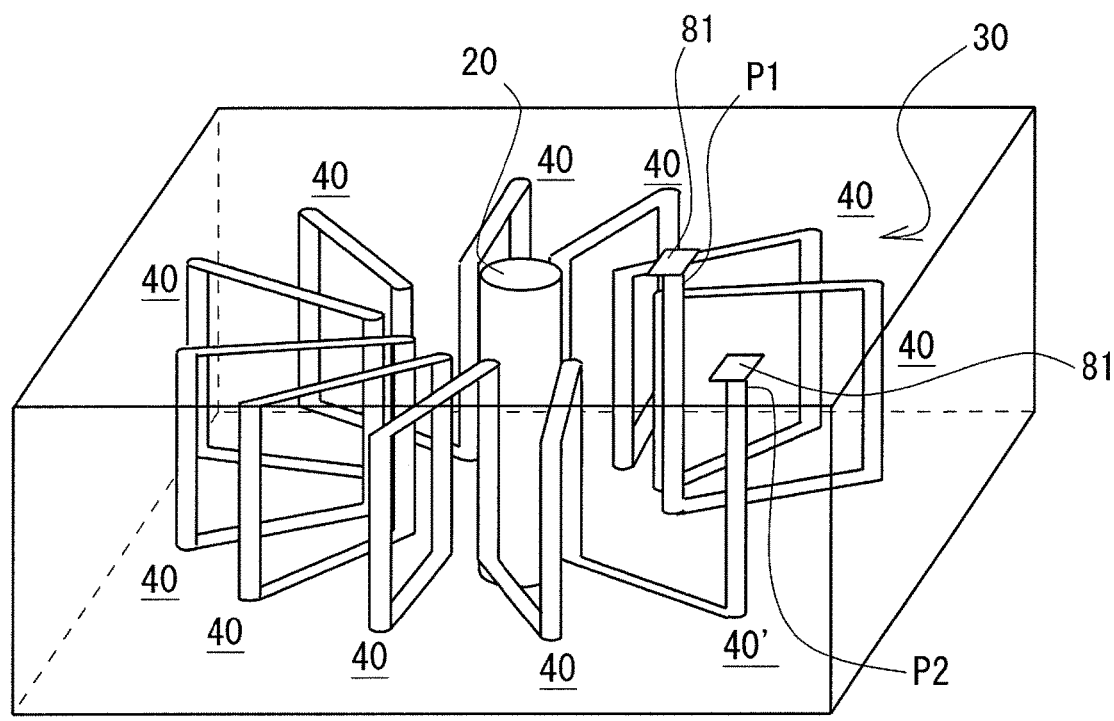

[FIG. 9]
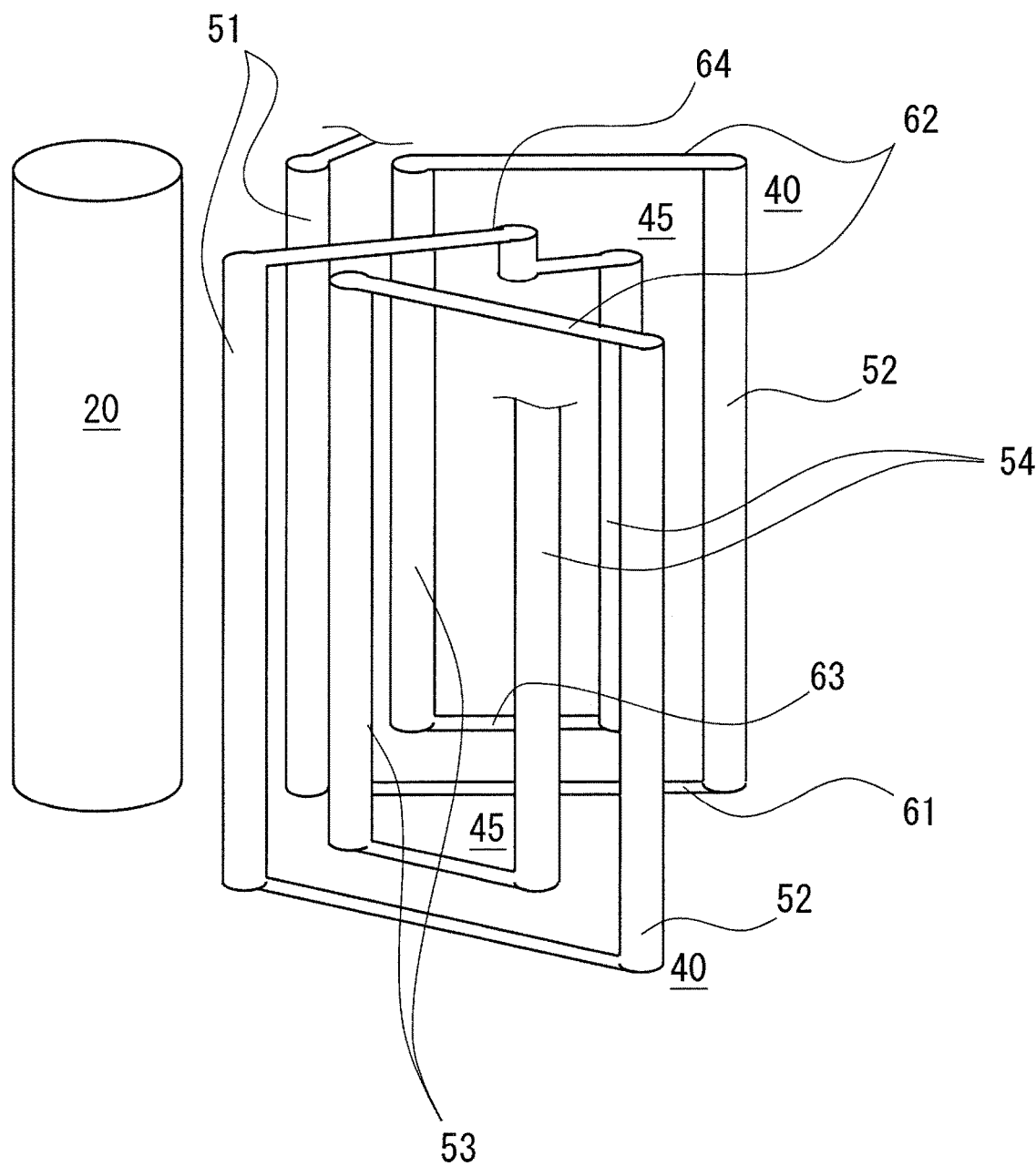

[FIG. 10]
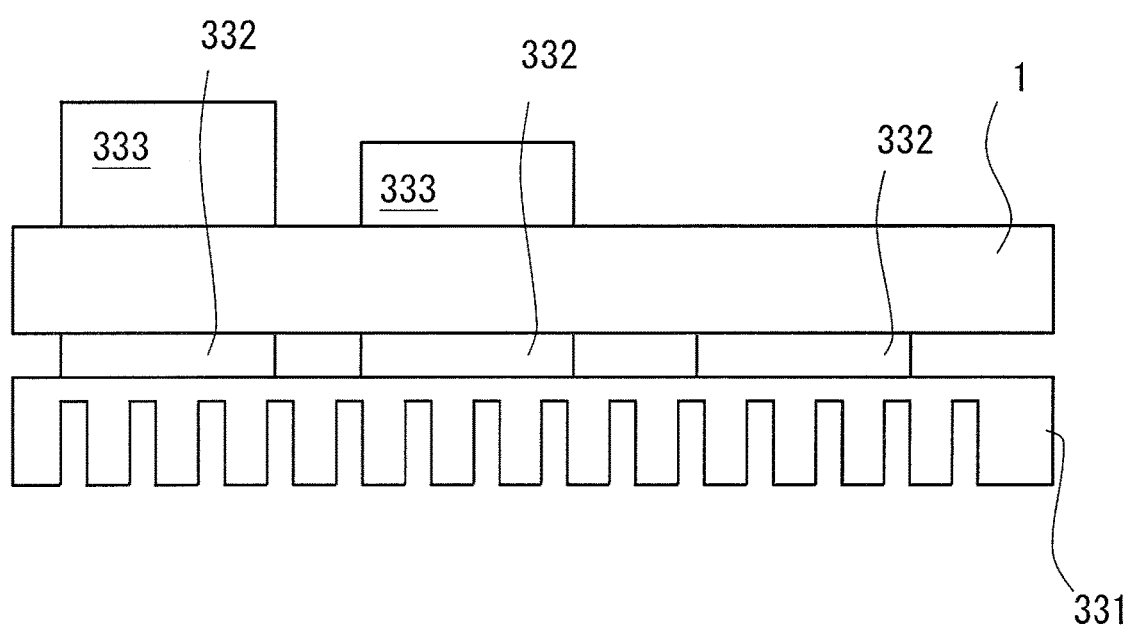

HEAT-RESISTANT DEVICE FOR CURRENT DETECTION

CROSS-REFERENCE TO RELATED APPLICATION

The present application claims a priority based on Japanese Patent Application No. 2016-248444, filed on Dec. 21, 2016 and entitled "Heat-resistant device for current detection", the entire content of which is hereby incorporated by reference.

TECHNICAL FIELD

The present disclosure relates to a heat-resistant device for current detection.

BACKGROUND

WO 2012/157373 discloses that electrodes are embedded in a ceramic substrate, for example, to promote a transmission of heat.

Japanese Patent Application Laid-open No. 2011-35414 discloses that a transformer is embedded in a ceramic substrate.

Japanese Patent Application Laid-open No. 2000-228323 discloses a Rogowski coil in which its coil wiring is provided in a printed substrate.

SUMMARY

There is a need to improve reliability of operation of a system or unit including multiple electronic devices even in harsh environments such as engine room where car engine is mounted. Such electronic devices may include integrated circuits (ICs), power transistors, capacitors, and inductors, but not necessarily limited thereto. A current flowing through the system or unit may be monitored, allowing a feedback control in the system and thus enhancing the reliability of the operation or allowing immediate detection of abnormality in the operation.

If a current sensor based on a printed substrate is placed in the harsh environment, the printed substrate may be thermally expanded or deformed, possibly lowering the current-sensing capability of the current sensor due to the change of geometric shape of wirings.

A heat-resistant device for current detection according to one aspect of the present disclosure may include:
a heat-resistant substrate including a ceramic material;
a group of power wirings embedded in the heat-resistant substrate; and
a coil structure including a coil wiring extending between a start point and an end point and, wherein coil units each including or corresponding to one turn of the coil wiring are arranged in a circumferential direction around the group of power wirings and between the start point and the end point of the coil wiring, wherein the coil unit includes:
a first conductor extending along the power wirings;
a second conductor extending along the power wirings and arranged farther from the group of power wirings than the first conductor;
a first connection wiring coupling the first and second conductors within the same coil unit; and
a second connection wiring coupling the first and second conductors between adjacent coil units in the circumferential direction, wherein
the first conductor, the second conductor, the first connection wiring, and second connection wiring are embedded in the heat-resistant substrate, wherein
at least the first conductor and the second conductor are not exposed outside of the heat-resistant substrate, and wherein
the respective first conductors are spaced by the substantially same minimum distance from an outer circumferential line surrounding the group of power wirings in a plane orthogonal to the extending direction of the group of power wirings.

In some exemplary embodiments, the device may further include at least one terminal wiring coupled to at least one of the first conductor, the second conductor, the first connection wiring, and the second connection wiring.

In some exemplary embodiments, the ceramic material may include at least one of alumina, silica, zirconia, titania, magnesia, and cordierite.

In some exemplary embodiments, the heat-resistant substrate may include a glass material.

In some exemplary embodiments, the power wirings and the coil structure may include the same metal material.

In some exemplary embodiments, the power wirings and the coil structure may include a copper.

In some exemplary embodiments, the adjacent coil units in the circumferential direction may be coupled via at least one intermediate coil unit that may be smaller in size than the coil unit.

In some exemplary embodiments, the intermediate coil unit may comprise: a third conductor extending along the power wirings; a fourth conductor arranged farther from the group of power wirings than the third conductor and extending along the power wirings; a third connection wiring coupling third and fourth conductors; and a fourth connection wiring coupling the third or fourth conductor to the first or second conductor.

In some exemplary embodiments, the first to fourth conductors may exist in the same plane.

In some exemplary embodiments, heat-resistant device may further include a return wiring extending in the circumferential direction toward the start point from the end point of the coil wiring of the coil structure in such a manner that the return wiring passes through the coil units.

An aspect of the present embodiment may provide a heat-resistant device for current detection with improved heat-resistant capability.

BRIEF DESCRIPTION OF DRAWINGS

FIG. 1 is a schematic perspective view of a heat-resistant device according to an aspect of the present disclosure, schematically illustrating power wirings and coil structure etc. embedded in the heat-resistant substrate. FIG. 1 is a schematic view mainly for illustrating the configuration of the power wirings and the coil structure. The coil structure is embedded in the heat-resistant substrate.

FIG. 2 is a schematic top view of the heat-resistant device shown in FIG. 1, schematically illustrating the wirings embedded in the heat-resistant substrate by broken lines. For the purpose of exemplary illustration, only one of first conductors and only one of second conductors are schematically illustrated by broken lines. A phantom line L1 illustrates smaller diameter imaginary circle in which first conductors are arranged. A phantom line L2 illustrates a larger diameter imaginary circle in which second conductors are arranged.

FIG. 3 is a schematic view illustrating an exemplary non-limiting method of manufacturing the heat-resistant devices shown in FIG. 1. FIG. 3 corresponds to the schematic cross-section along the line of in FIG. 2.

FIG. 4 is a schematic view illustrating an exemplary non-limiting method of manufacturing the heat-resistant devices shown in FIG. 1. FIG. 4 corresponds to the schematic cross-section along the line of IV-IV in FIG. 2.

FIG. 5 is a schematic view illustrating a structure after stacking and co-firing of so-called green sheets (unfired sheet) shown in FIG. 3.

FIG. 6 is a schematic view illustrating a structure after stacking and co-firing of green sheets shown in FIG. 4.

FIG. 7 is schematic partial top view of the heat-resistant substrate, illustrating a variation of a group of power wirings.

FIG. 8 is a schematic perspective view of a heat-resistant device according to another embodiment of the present disclosure, schematically illustrating power wirings and coil structure and so on embedded in the heat-resistant substrate. FIG. 8 is a schematic view mainly for illustrating the configurations of the power wirings and the coil structure. The coil structure is embedded in the heat-resistant substrate.

FIG. 9 is a schematic view illustrating portions of the power wiring and the coil structure included in the heat-resistant device, illustrating an example in which adjacent coil units in the circumferential direction around the power wiring are coupled via an intermediate coil unit.

FIG. 10 is a schematic view illustrating an example of assembly in which the heat-resistant device is assembled.

DETAILED DESCRIPTION

Hereinafter, non-limiting exemplary embodiments will be described with reference to FIGS. 1-10. One or more embodiments disclosed herein and respective features disclosed in the embodiments are not mutually exclusive. A skilled person could properly combine the respective embodiments and/or respective features without requiring excess descriptions, and could understand the synergic effects by such combinations. Overlapping descriptions among embodiments will be basically omitted. Referenced figures are mainly for the purpose of illustrating the feature and may be simplified for the sake of convenience.

FIG. 1 is a schematic perspective view of a heat-resistant device according to an aspect of the present disclosure, schematically illustrating power wirings and coil structure and so on embedded in the heat-resistant substrate. FIG. 1 is a schematic view mainly for illustrating the configuration of the power wirings and the coil structure. The coil structure is embedded in the heat-resistant substrate. FIG. 2 is a schematic top view of the heat-resistant device shown in FIG. 1, schematically illustrating the wirings embedded in the heat-resistant substrate by broken lines. For the purpose of exemplary illustration, only one of first conductors and only one of second conductors are schematically illustrated by broken lines. A phantom line L1 illustrates smaller diameter imaginary circle in which first conductors are arranged. A phantom line L2 illustrates a larger diameter imaginary circle in which second conductors are arranged.

As shown in FIGS. 1 and 2, the heat-resistant device 1 for current detection may have a heat-resistant substrate 10, a group of power wirings 20 embedded in the heat-resistant substrate 10, and a coil structure 30 for detecting a current flowing through the group of power wirings 20. This coil structure 30 may be referred to as a toroidal coil or Rogowski coil. The group of power wirings 20 may include and/or may be configured by a plurality of power wirings 29 as schematically illustrated in FIG. 1. In some cases, the group of power wirings 20 includes and is configured by three or more power wirings 29.

The heat-resistant substrate 10 may include a ceramic material as a main component, thus this heat-resistant substrate 10 may be simply referred to as a ceramic substrate. The main component indicates that mass % (and/or weight %) of a component is greater than mass % (and/or weight %) of any other components. In other words, mass % (or weight %) of the main component is the greatest compared to other components. When the heat-resistant substrate 10 includes the ceramic material, the heat-resistant capability of the heat-resistant substrate 10 may be improved, and thus thermal expansion and/or deformation of the wiring may be avoided or suppressed even if it is placed under a high temperature environment.

In some cases, the ceramic material that is the main component in the heat-resistant substrate 10 may include one or more material selected from a group consisting of alumina ($Al_2O_3$), silica ($SiO_2$), zirconia ($ZrO_2$), titania ($TiO_2$), magnesia (MgO), and cordierite ($2MgO.2Al_2O_3.5SiO_2$).

The heat-resistant substrate 10 may include other material as non-main components additionally to the ceramic material as a main component. In some cases including the instantly illustrated example, the heat-resistant substrate 10 may include a glass material as non-main component additionally to the ceramic material as a main component. The glass material content may be equal to or greater than 31 wt %, preferably equal to or greater than 36 wt %, and more preferably equal to or greater than 41 wt %. The glass material having lower melting point than the ceramic material may be included in the heat-resistant substrate 10, facilitating lower firing temperature described below in relation to a method of manufacturing heat-resistant devices 1. The heat-resistant substrate 10 that is a mixture of alumina ($Al_2O_3$) and glass material is categorized as so-called LTCC (Low Temperature Co-fired Ceramics). When the heat-resistant substrate 10 is a LTCC substrate, the use of copper or silver or alloy including copper or silver as a main component for the power wirings 29 and/or coil structure 30 may be facilitated. The unfired LTCC substrate may be fired in the temperature range between 900 degrees Celsius to 1000 degrees Celsius so that mechanical strength and heat-resistant capability of the obtained heat-resistant substrate 10, i.e. LTCC substrate may be achieved. Moreover, the same material as copper wirings that may likely be included in electronic devices such as integrated circuits (ICs), power transistors, capacitors, and inductors can be facilitated to be used for the power wirings 29 and/or coil structure 30, thus promoting much secured electrical connection between the electronic device and the heat-resistant substrate 10 under a high temperature atmosphere. For example, a solder suitable for copper may be selectable for that electrical connection between the same copper portions, ex. the copper terminal electrode of the electronic device and the copper terminal wiring in the heat-resistant substrate 10.

Each power wiring 29 included in the group of power wirings 20 may be comprised of a copper or a silver, or may include a copper or a silver as a main component, or may include an alloy including a copper or a silver as a main component. The coil structure 30 may be made of a copper or a silver, or may include a copper or a silver as a main component, or may include an alloy including a copper or a silver as a main component. In some embodiments, the power wiring 29 and the coil structure 30 include the same metal material, not necessarily limited to though.

The group of power wirings 20 and the respective power wirings 29 thereof are embedded in the heat-resistant substrate 10. In FIGS. 1 and 2, an example is illustrated where 4 power wirings 29 are provided. However, various modifications would be easily envisaged where 4 or more power wirings 29 are provided as would be understood from the following descriptions. The respective power wirings 29 may extend in the thickness direction of the heat-resistant substrate 10 in some cases. The thickness of the heat-resistant substrate 10 can be defined by the first surface 18 and the second surface 19 of the heat-resistant substrate 10 where the second surface 19 is at the opposite side to the first surface 18. The power wirings 29 may be provided to penetrate through the heat-resistant substrate 10 between the first surface 18 and the second surface 19 of the heat-resistant substrate 10. However, in other cases, one or both ends of the power wirings 29 can be totally or partially embedded in the heat-resistant substrate 10. The power wirings 29 are illustrated as cylinder, but its section orthogonal to its extending direction may include various profiles other than a circle such as a polygon including a triangle, a rectangle, and a pentagon and/or a star etc. It is also envisaged that the diameter or width of the power wiring 29 may change along its extending direction.

Various manner of coupling between one end of the group of power wirings 20, i.e. respective ends of the respective power wirings 29 embedded in the heat-resistant substrate 10 and an terminal wiring 83 would be envisaged. FIG. 2 illustrates an example where the terminal wiring 83 formed on the first surface 18 of the heat-resistant substrate 10 is coupled to the first end of the group of power wirings 20. It is similarly understandable that the terminal wiring 83 formed on the second surface 19 of the heat-resistant substrate 10 is coupled to the second end of the group of power wirings 20. It is also envisaged that the terminal wiring 83 can be omitted and a terminal of other electronic device can be bump-bonded to the first or second end of the group of power wirings 20. The first end of the group of power wirings 20 may be understood as an equivalent of the group of first ends of the respective power wirings 29 included in the group of power wirings 20. The second end of the group of power wirings 20 may be understood as an equivalent of the group of second ends of the respective power wirings 29 included in the group of power wirings 20.

As described above, the power wiring 29 may be made of a copper or a silver, or may include a copper or a silver as a main component, or may include an alloy including a copper or a silver as a main component. If a mixture at least including ceramic material and glass material is utilized for the heat-resistant substrate 10, a copper or a silver may be allowed to be used for the power wirings 29.

The coil structure 30 may be provided to detect a current flowing through the group of power wirings 20. As widely known in this technical field, non-illustrated integrator circuit may be coupled to the coil structure 30, allowing a current flowing through the group of power wirings 20 to be measured. At the time of filling of this application, such current detection methods are widely known, thus explanation for these methods are omitted.

As would be well understood from FIG. 1, the coil structure 30 may be structured by a coil wiring 31 extending from a start point P1 to an end point P2. The coil wiring 31 of the coil structure 30 spirally extends along the circumferential direction around the group of power wirings 20. The coil structure 30 may include a plurality of coil units 40 each including or corresponding to one turn of the coil wiring 31. The plurality of coil units 40 are arranged in the circumferential direction around the group of power wirings 20 and between the start point P1 and the end point P2 of the coil wiring 31. It should be noted that, as would be understood from the following descriptions, the coil structure 30 may include a wiring structure which is shorter than the coil unit 40 defined below and thus which may be referred to as a semi coil unit 40'.

The respective coil units 40 included in the coil structure 30 may have a first conductor 51, a second conductor 52, a first connection wiring 61, and a second connection wiring 62. The first conductor 51 may extend along the power wirings 29 and, optionally may extend substantially in parallel to the power wirings 29. The second conductor 52 may be arranged farther from the group of power wirings 20 than the first conductor 51. The second conductor 52 may extend along the power wirings 29 and, optionally may extend substantially in parallel to the power wirings 29. The first connection wiring 61 couples the first and second conductors 51, 52 within the same coil unit 40. The second connection wiring 62 couples the first and second conductors 51, 52 between the adjacent coil units 40 in the circumferential direction.

The first conductor 51 may extend along the respective power wirings 29 included in the group of power wirings 20 and, optionally may extend substantially in parallel to the respective power wirings 29. The second conductor 52 may be arranged farther from the group of power wirings 20 than the first conductor 51. The second conductor 52 may extend along the respective power wirings 29 included in the group of power wirings 20 and optionally may extend substantially in parallel to the respective power wirings 29.

As would be understood from FIGS. 1 and 2, the respective first conductors 51 are spaced by the same minimum distance "d" from an outer circumferential line L3 surrounding the group of power wirings 20 in a plane orthogonal to the extending direction of the group of power wirings 20. The outer circumferential line L3 may be defined by continuously arranged tangential lines in the circumferential direction each tangential line being in contact with the outer circumferences of the power wirings 29 adjacent in the circumferential direction. In the case of FIGS. 1 and 2, the outer circumferential line L3 is defined by the combination of four tangential lines which are continuously arranged in the circumferential direction and each of which contacts the outer circumferences of the two power wirings 29 adjacent in the circumferential direction. In the case of FIGS. 1 and 2, the outer circumferential line L3 is shaped like a rectangle, but could be shaped like a polygon such as a triangle, a pentagon, a hexagon, an octagon, a nonagon or the like in other embodiments.

It is envisaged that the minimum distances "d" between the outer circumferential line L3 and the first conductors 51 may be varied within a given range, in accordance with the geometric profile of the outer circumferential line L3 or the cross-sectional profile of the first conductor 51 or the arrangement of the first conductors 51 relative to the outer circumferential line L3 and/or in accordance with errors in manufacturing. That range may be defined by at least one of the following conditions: $0.7<(d_{min}/d_{max})$; or $0.75<(d_{min}/d_{max})$; or $0.8<(d_{min}/d_{max})$; or $0.85<(d_{min}/d_{max})$; or $0.9<(d_{min}/d_{max})$; or $0.95<(d_{min}/d_{max})$, where $d_{max}$ represents the maximum value among the minimum distances "d" between the outer circumferential line L3 and the first conductor 51 and $d_{min}$ represents the minimum value among the minimum distances "d" between the outer circumferential line L3 and the first conductor 51. The "the substantially same minimum distance d" stated in the presently accompanied Claims should not be limited to the perfectly or totally identical distance but would include the above suggested fluctuations. In another approach, doctrine of equivalents of the present invention should be found for alleged infringing articles despite of the fluctuations in the minimum distance d in the alleged infringing articles.

As shown in FIG. 2, the first conductors 51 are aligned and equally spaced in the smaller diameter imaginary circle L1 which is illustrated by a phantom line L1 and which has a center that coincides with a center of the group of power wirings 20. The respective second conductors 52 are spaced by the same distance d from the outer circumferential line L3 around the group of power wirings 20 in a plane orthogonal to the extending direction of the power wirings 29, not necessarily limited to though. The second conductors 52 are aligned and equally spaced in the larger diameter imaginary circle L2 which is illustrated by a phantom line L2 and which has a center that coincides with a center of the group of power wirings 20. The smaller and larger imaginary circles L1, L2 may be concentrically arranged, not necessarily limited to though.

The first conductors 51 have a first end at the side of the first surface 18 of the heat-resistant substrate 10 and a second end at the side of the second surface 19 of the heat-resistant substrate 10. Similarly, the second conductors 52 have a first end at the side of the first surface 18 of the heat-resistant substrate 10 and a second end at the side of the second surface 19 of the heat-resistant substrate 10. In some cases, the respective conductors may be shaped like columns extending in parallel to the group of power wirings 20 and the respective power wirings 29. Within the same coil unit 40, the direction of instantaneous current that flows through the first conductor 51 is opposite to the direction of the instantaneous current that flows through the second conductor 52. Accordingly, reduction of common mode noise in induced current may be facilitated. In some cases, alternating current may flow through the group of power wirings 20 and the respective power wirings 29. In some cases, high-frequency electric current of 100 A or more may flow through the group of power wirings 20 and respective power wirings 29.

The first connection wiring 61 may couple the first and second conductors 51, 52 within the same coil unit 40 and, optionally may couple the second ends of the first and second conductors 51, 52. The first connection wiring 61 may linearly extend radially outwardly relative to the above-described imaginary circles from the second end of the first conductor 51 to the second end of the second conductor 52.

The second connection wiring 62 may couple the first and second conductors 51, 52 between adjacent coil units 40 in the circumferential direction. In other words, the second connection wiring 62 may couple the first end of the second conductor 52 belonging to a given coil unit 40 and the first end of the first conductor 51 belonging to another coil unit 40 adjacent to that given coil unit 40 in the circumferential direction. The second connection wiring 62 may linearly extend radially inwardly relative to the above-described imaginary circles from the first end of the second conductor 52 to the first end of the first conductor 51.

The number of coil units 40 included in the coil structure 30 may be varied and should not be limited to the exemplary number of illustrated pieces. The interval (angular interval) in the circumferential direction for the second connection wirings 62 of the coil units 40 may be set variously, and should not be limited to the exemplary illustration. The same holds true for the first connection wiring 61. The length of the first conductor 51 may not necessarily be shorter than the length of the power wiring 29, and it could be longer. The same holds true for the second conductor 52. The power wiring 29 is not necessarily be greater in diameter than the first and second conductors 51, 52. The power wiring 29 may be divided into a plurality of smaller-diameter power wirings. It should be noted that the plurality of smaller diameter power wirings may be coupled between the common current-input-terminal and the common current-output-terminal.

In some cases, as would be understood from FIG. 1, the heat-resistant substrate 10 may optionally and additionally have a return wiring 70 extending in the circumferential direction toward the start point P1 from the end point P2 of the coil wiring 31 of the coil structure 30 in such a manner that the return wiring 70 passes through the coil units 40. The return wiring 70 may be embedded in the heat-resistant substrate 10. A current flowing in the opposite direction to the direction of a current flowing through the coil wiring 31 may flow through the return wiring 70, resulting in the reduced common mode noise. The return wiring 70 may be omitted as would be understood from the following variations. The return wiring 70 may extend through the coil units 40 from the start point P3 to the end point P4 in the circumferential direction. The return wiring 70 may exist in a plane orthogonal to the power wirings 29.

A terminal wiring 82 may be coupled to the end point P4 of the return wiring 70. The terminal wiring 82 may have a column-like portion 82$j$ coupled to the end point P4 of the return wiring 70, and a linear portion 82$k$ that is coupled to the top end of the column-like portion 82$j$ and extends on the first surface 18 of the heat-resistant substrate 10. Electrical contacts would be variously given to the return wiring 70. It is envisaged that the linear portion 82$k$ of the terminal wiring 82 is omitted, and a terminal of other electronic device may be bump-bonded to the column-like portion 82$j$ of the terminal wiring 82.

If the coil structure 30 is not embedded in the heat-resistant ceramic substrate 10, the position of the coil structure 30 relative to the power wirings 29 may possibly change due to thermal expansion. In the present embodiment, the power wirings 29 and the coil structure 30 may be embedded in the heat-resistant substrate 10. The coil wiring 31 of the coil structure 30 may not be exposed outside of the heat-resistant substrate 10 or may partially exposed outside of the heat-resistant substrate 10. Therefore, the thermal expansion of the coil structure 30 and the power wirings 29 may be suppressed due to the ceramic material and/or ceramic portion of the heat-resistant substrate 10, thereby effectively reducing thermal effect against the relative positioning between the coil structure 30 and the power wirings 29 and the relative positioning between the coil units 40 and the power wirings 29. As a result of that, the accuracy of detection of current may be improved.

If the coil structure 30 is not embedded in the heat-resistant ceramic substrate 10, an area surrounded by the coil structure 30 may possibly vary due to thermal expansion. In other words, an area surrounded by the plurality of first conductors 51 in a cross-sectional plane orthogonal to the extending direction of the group of power wirings 20 and the respective power wirings 29 may vary. In the present embodiment, the first conductors 51, the second conductors 52, the first connection wirings 61, and the second connection wirings 62 of the coil units 40 are embedded in the heat-resistant substrate 10. The first conductors 51 and the second conductors 52 in the coil units 40 are not exposed outside of the heat-resistant substrate 10. The first connection wirings 61 and the second connection wirings 62 in the coil units 40 are not exposed outside of the heat-resistant substrate 10 or are partially exposed outside of the heat-resistant substrate 10 at the first surface 18 or the second surface 19 of the heat-resistant substrate 10. The exposure of the coil structure 30 and coil units 40 from the heat-resistant substrate 10 which are more susceptible to the thermal influence than the heat-resistant substrate 10 may be avoided or suppressed, thus effectively reducing the thermal influence against the geometric shape of the coil structure 30 and the coil units 40. As a result of that, the accuracy of detection of current may be improved.

Furthermore, in the present embodiment, the respective first conductors 51 are spaced by the same minimum distance "d" from the outer circumferential line L3 surrounding the group of power wirings 20 in a plane orthogonal to the extending direction of the group of power wirings 20. If high frequency current flows through the power wirings 29, a skin effect, i.e. a phenomenon in which high frequency current tends to flow nearby the surface of the power wiring 29 may be caused. If plural thinner wirings instead of a single thick wiring are used for the power wiring, the total surface area of power wiring may be increased and the resistance of power wiring for the high frequency current may be reduced.

The terminal wiring 81 for causing a current to flow through the coil structure 30 may be provided in various manners. For example, at least one terminal wiring 81 may be coupled to at least one of the first conductor 51, the second conductor 52, the first connection wiring 61, and the second connection wiring 62 of the coil unit 40. In some cases, as shown in FIG. 1, the terminal wiring 81 may have a column-like portion 81j which could be an extended portion of the first conductor 51 of the coil unit 40; and a linear portion 81k that is coupled to the top end of the column-like portion 81j and extends on the first surface 18 of the heat-resistant substrate 10. It is envisaged that the linear portion 81k of the terminal wiring 81 may be omitted, and a terminal of other electronic device may be bump-bonded to the column-like portion 81j of the terminal wiring 81.

As stated at the beginning, the coil structure 30 may include a wiring structure, i.e. semi coil unit 40' which is shorter than the coil unit 40 defined above. For example, if the terminal wiring 81 is coupled to the first conductors 51 of one given coil unit 40, then the first connection wiring 61, the second conductor 52, and the second connection wiring 62 in that given coil unit 40 may be omitted. If the terminal wiring 81 is coupled to the first connection wiring 61 of one given coil unit 40, then the second conductor 52 and second connection wiring 62 in that given coil unit 40 may be omitted. If the terminal wiring 81 is coupled to the second conductor 52 in one given coil unit 40, then the second connection wiring 62 in that given coil unit 40 may be omitted. Again, a coil unit 40 that is not provided with one or more of the first conductor 51, the first connection wiring 61, the second conductor 52, and the second connection wiring 62 may be referred to as a semi-coil unit 40'. In some cases, the coil structure 30 may include a plurality of semi-coil units 40'.

Various methods may be employed to manufacture the heat-resistant devices 1 such as shown in FIGS. 1 and 2. FIGS. 3 to 6 schematically illustrate an exemplary non-limiting method of manufacturing of heat-resistant devices 1. FIG. 3 is a schematic view illustrating an exemplary non-limiting method of manufacturing of the heat-resistant devices, and FIG. 3 corresponds to the schematic cross-section along the line of III-III in FIG. 2. FIG. 4 is a schematic view illustrating an exemplary non-limiting method of manufacturing the heat-resistant devices, and FIG. 4 corresponds to the schematic cross-section along the line of IV-IV in FIG. 2. FIG. 5 is a schematic view illustrating a structure after stacking and co-firing of so-called green sheets shown in FIG. 3. FIG. 6 is a schematic view illustrating a structure after stacking and co-firing of green sheets shown in FIG. 4.

As an overview, green sheet 11-16 shown in FIGS. 3 and 4 are prepared, and then they are stacked and fired. The green sheet may be unfired ceramic or LTCC sheet.

Each green sheet 11-16 may include ceramic powder (ex. alumina powder), glass powder, binder powder (ex. PVB (polyvinyl butyral)), and a solvent (for example, butanol and ethanol). An organic substance such as the binder and the solvent included in the green sheet 11-16 may be removed during firing so that a fired article of the mixture of ceramic and glass may be obtained.

Each green sheet 11-16 may be configured so that, after stacking and co-firing of the green sheets 11-16, the coil structure 30 and the return wiring 70 are constructed as shown in FIGS. 1 and 2. For example, holes may be formed at appropriate predetermined positions in the respective green sheets 11-16, and these holes may be filled with conductive paste. A predetermined patterned layer of the conductive paste may be formed on the sheet surface of each green sheet 11-16. That is, a pattern of the conductive paste may be formed on the sheet surface of each green sheet 11-16. During the co-firing of the green sheets 11-16, the organic substance in the conductive paste may be removed, and metal particles in the conductive paste may be sintered together, and then parts such as the power wirings 29 and the coil structure 30 may be formed.

The conductive paste may include, as a conductor in the conductive paste, metal particles which will form the power wirings 29 and/or the coil structure 30. In some cases, the metal particles in the conductive paste may include a copper or a silver as a main component, or may include an alloy including a copper or a silver as a main component. The conductive paste may include a binder and/or a solvent of organic substance, additionally to the metal particles such as copper or silver particles. If a printing technique is utilized, then patterns of conductive paste may be formed on the sheet surface of the green sheet efficiently and precisely. It should be noted that various methods such as punching, cutting or laser ablation may be employed for forming holes in the green sheets 11-16.

An exemplary non-limiting method of manufacturing the heat-resistant devices 1 may include some or all of the following steps.

1st step: ceramic powder (ex. alumina powder) and glass powder are mixed. An appropriate mixer may be utilized.

2nd step: the mixed powder of the ceramic and glass powders obtained by the 1st step, binder powder, and solvent are mixed in a mixer tank to produce a slurry. Impellers may be revolved inside of the mixer tank so that sufficient mixing of components may be facilitated.

3rd step: The slurry is formed to be a sheet with a predetermined thickness, and then this sheet is dried through heating so that the green sheet is produced.

4th step: the green sheet is cut to have a predetermined size.

5th step: holes are formed at predetermined positions in the green sheet of the predetermined size.

6th step: the holes in the green sheet are filled with conductive paste and the conductive paste is formed as a layer on the sheet surface of the green sheet. In some cases, the conductive paste may be printed onto the sheet surface of the green sheet. The printing technique may include screen printing and so on.

7th step: the green sheets are stacked in which holes are filled with conductive paste and/or patterns of conductive paste are formed on the sheet surfaces. If required, the stacked green sheets may be pressed in the stack direction, thereby producing a stack of green sheets in which adjacent green sheets in the stack direction stick together.

8th step: the stack of green sheets are defatted and fired in non-oxidizing atmosphere.

In some cases, the green sheet 11 may be a LTCC (Low Temperature Co-fired Ceramics) sheet. In other words, the green sheet 11 may include at least both of a glass material and one or more ceramic material selected from a group consisting of alumina ($Al_2O_3$), silica ($SiO_2$), zirconia ($ZrO_2$), titania ($TiO_2$), magnesia (MgO), cordierite ($2MgO.2Al_2O_3.5SiO_2$). In some cases, the green sheet 11 may include alumina and glass material. The benefit of combination of these components might be apparent from above descriptions.

Reference is made to illustrated particular embodiments. First unfired portions 921 which will be first portions of the respective power wirings 29 in the group of power wirings 20 are embedded in the first green sheet 11. The top surface of the first green sheet 11 is provided with first unfired connection wiring 961. In particular, the first unfired portion 921 is made of the above-described conductive paste and will form, after being fired, the first portion of the power wiring 29 in the heat-resistant device 1. Similarly, the first unfired connection wiring 961 is made of the above-described conductive paste and will form the first connection wiring 61 after being fired. The first unfired portion 921 may be embedded in the first green sheet 11 such that the top surface of the first unfired portion 921 is arranged in the same plane as the top surface of the green sheet 11.

Second unfired portions 922 which will be second portions of the respective power wirings 29 in the group of power wirings 20 are embedded in the second green sheet 12. Unfired portions 951, 952 which will be portions of first and second conductors 51, 52 in the coil unit 40 are also embedded in the second green sheet 12. In particular, the second unfired portions 922 is made of the above-described conductive paste and will form the second portion of the power wiring 29 after being fired. Similarly, the unfired portions 951, 952 is made of the above-described conductive paste which will be portions of first and second conductors 51, 52.

Third unfired portions 923 which will be third portions of the respective power wirings 29 in the group of power wirings 20 are embedded in the third green sheet 13. Unfired portions 951, 952 which will be portions of first and second conductors 51, 52 in the coil unit 40 are also embedded in the third green sheet 13. The top surface of the third green sheet 13 is provided with an unfired return wiring 970 which will be the return wiring 70 after being fired.

Fourth unfired portions 924 which will be fourth portions in the power wiring 29 are embedded in the fourth green sheet 14. Also, unfired portions 951, 952 which will be portions of first and second conductors 51, 52 are embedded in the fourth green sheet 14.

Fifth unfired portions 925 which will be fifth portions in the power wiring 29 are embedded in the fifth green sheet 15. Also, unfired portions 951, 952 which will be portions of first and second conductors 51, 52 are embedded in the fifth green sheet 15. The top surface of the green sheet 15 is provided with second unfired connection wiring 62 which will be the second connection wiring 62 after being fired.

Sixth unfired portions 926 which will be sixth portions in the power wiring 29 are embedded in the sixth green sheet 16. The 3rd to 6th unfired portions 923, 924, 925, 926 may be made of above-described conductive paste, not necessarily limited to though. Similarly, above-suggested unfired portions 951, 952 which will be portions of first and second conductors 51, 52 and the second unfired connection wiring 962 may be made of above-described conductive paste, not necessarily limited to though.

These green sheets 11-16 may be stacked and co-fired so that adjacent green sheets in the stack direction will be sintered together. In particular, the ceramic material is sintered between the adjacent green sheets in the stack direction; so that adjacent unfired portions 921-926 in the stack direction are sintered together to form the power wiring 29; so that adjacent unfired portions 951 in the stack direction are sintered together to form the first conductor 51; and so that adjacent unfired portions 952 in the stack direction are sintered together to form the second conductor 52. Furthermore, the unfired portion 951 and the first unfired connection wiring 961 are sintered together; the unfired portion 951 and the second unfired connection wiring 962 are sintered together; the unfired portion 952 and the first unfired connection wiring 961 are sintered together; and the unfired portion 952 and the second unfired connection wiring 962 are sintered together. Still further, the unfired return wiring 970 is sintered and coupled to the end point P2 of the coil structure 30. If required, sintering between an unfired portion of the coil structure 30 and the unfired terminal wiring 81 and sintering between the unfired return wiring 970 and the unfired terminal wiring 82 may be performed.

Other embodiments are envisaged in which a plurality of power wirings 29 and an integrated part of coil structure 30 and return wiring 70 are embedded into a body of ceramic particles, and then this is sintered so that the heat-resistant device 1 is produced. The power wirings 29 may be obtained through processing of a metal wire. The integrated part of coil structure 30 and return wiring 70 may be obtained through processing of a metal wire. If the return wiring 70 is omitted, the metal structure embedded in the body of ceramic material may be simplified. If a 3D printer is utilized, geometrical shape of the metal structure to be embedded into the body of ceramic material may be precisely shaped.

FIG. 7 is schematic partial top view of the heat-resistant substrate, illustrating a variation of a group of power wirings. In the case of FIG. 7, similar to the above-described embodiments, the respective first conductors 51 are spaced by the same minimum distance "d" from the outer circumferential line L3 surrounding the group of power wirings 20 in a plane orthogonal to the extending direction of the group of power wirings 20. Accordingly, similar technical effects may be achieved.

In the case of FIG. 7, the group of power wirings 20 consists of 7 power wirings 29. The group of power wirings 20 includes one center power wiring 29 and 6 outer power wirings 29 surrounding this center power wiring 29. The outer circumferential line L3 consists of continuously arranged 6 tangential lines in total in the circumferential direction each tangential line being contact with the outer circumferences of the outer power wirings 29 adjacent in the circumferential direction. The center of the outer circumferential line L3 may correspond or equal to the center power wiring 29 or the center of the center power wiring 29.

The outer power wirings 29 in the group of power wirings 20 contribute in defining the outer circumferential line L3. In contrast, the center power wiring 29 in the group of power wirings 20 does not contribute in defining the outer circumferential line L3. In some cases, the number of outer power wirings 29 is greater than the number of center power wiring(s) 29. Accordingly, fluctuation in the distance d repeatedly described herein may be reduced.

As a variation, another embodiment is envisaged in which two or more center power wirings 29 may be provided. Another embodiment is envisaged in which 4, 5, 6, 7, 8, or 9 or more outer power wirings 29 are provided additionally to or without one or more center power wirings 29. As the number of outer power wirings 29 increases, it is expected that the outer circumferential line L3 may likely be shaped closer to a circular shape or oval shape.

FIG. 8 is a schematic perspective view of a heat-resistant device according to another embodiment of the present disclosure, schematically illustrating power wirings and coil structure and so on embedded in the heat-resistant substrate. FIG. 8 is a schematic view mainly for illustrating the configurations of the power wirings and the coil structure. In this embodiment either, similar to the above embodiment or example, the coil structure 30 is embedded in the heat-resistant substrate 10. Thus, technical effects similar to above-described embodiments or examples may be achieved. It should be noted that the group of power wirings 20 similar to ones in FIGS. 1 and 7 is provided in FIG. 8, but illustrated as a single cylinder for the convenience of illustration.

In the case of FIG. 7, the return wiring 70 is omitted. As described in above embodiments or examples, within the same coil unit 40, the direction of instantaneous current that flows through the first conductor 51 is opposite to the direction of the instantaneous current that flows through the second conductor 52. Accordingly, reduction of common mode noise in induced current may be facilitated.

FIG. 9 is a schematic view illustrating portions of the power wiring and the coil structure included in the heat-resistant device, illustrating an example in which adjacent coil units in the circumferential direction around the power wiring are coupled via an intermediate coil unit. It should be noted that the group of power wirings 20 similar to ones in FIGS. 1 and 7 is provided in FIG. 9, but illustrated as a single cylinder for the convenience of illustration. In the variation example of FIG. 9, the adjacent coil units 40 in the circumferential direction are coupled via at least one intermediate coil unit 45 which is smaller in size than the coil unit 40. The second connection wiring 62 in the coil unit 40 couples the first or second conductor 51, 52 and the intermediate coil unit 45, instead of coupling the first and second conductors 51, 52 between adjacent coil units 40 in the circumferential direction. The addition of the intermediate coil unit 45 may promote the higher density arrangement of coil units in the coil structure 30 and promote the enhanced current detection capability.

The intermediate coil unit 45 may include a third conductor 53 extending along the group of power wirings 20 or the power wirings 29 included in the group of power wirings 20; a fourth conductor 54 arranged farther from the group of power wirings 20 than the third conductor 53 and extending along the group of power wirings 20 or the power wirings 29 included in the group of power wirings 20; a third connection wiring 63 coupling third and fourth conductors 53, 54; and a fourth connection wiring 64 coupling the third or fourth conductor 53, 54 to the first or second conductor 51, 52. The third and fourth conductor 53, 54 may extend substantially in parallel to the group of power wirings 20 or the power wirings 29.

In some cases, as shown in FIG. 9, the fourth connection wiring 64 couples the fourth conductor 54 and the first conductors 51. In some cases, as shown in FIG. 9, the first to fourth conductors 51-54 exist in the same plane. This plane may be a plane crossing the outer circumferential line L3.

Further variation examples would be envisaged in which the adjacent coil units 40 in the circumferential direction may be coupled via two or more intermediate coil units.

FIG. 10 is a schematic view illustrating an example of assembly in which the heat-resistant device is assembled. As shown in FIG. 10, the heat-resistant substrate 10 of the heat-resistant device 1 may be utilized as a circuit board on which a plurality of electronics are mounted. A plurality of first electronic devices 332 are mounted on the bottom surface of the heat-resistant substrate 10. A plurality of second electronic devices 333 are mounted on the top surface of the heat-resistant substrate 10. The first electronic devices 332 may be active elements such as SiC-based MOSFET etc. The second electronic devices may be passive elements such as capacitors and resistors etc.

The first electronic devices 332 may be coupled to a heatsink 331, in particular mounted on to the heatsink 331. Heat caused by operation of the first electronic devices 332 reaches the heatsink 331 so that over-heating of the first electronic devices 332 is thus suppressed. The heatsink 331 may be of air-cooled type for example. The assembly shown in FIG. 10 does not include highly active cooling mechanism. This is the result of improvement of heat-resistant capability of each parts included in the assembly.

In view of the above descriptions, a skilled person could add various modifications to the respective embodiments.

REFERENCE SIGNS LIST 1 heat-resistant device
10 heat-resistant substrate
20 power wiring
30 coil structure
40 coil unit
51 first conductor
52 second conductor
53 third conductor
54 fourth conductor
61 first connection wiring
62 second connection wiring
63 third connection wiring
64 fourth connection wiring

What is claimed is:

1. A heat-resistant device for current detection, comprising:
 a heat-resistant substrate including a ceramic material;
 a group of power wirings embedded in the heat-resistant substrate, the group of power wirings being adapted for flowing a common high frequency alternating current; and
 a coil structure including a coil wiring extending between a start point and an end point, wherein coil units each including or corresponding to one turn of the coil wiring are arranged in a circumferential direction around the group of power wirings and between the start point and the end point of the coil wiring, wherein the coil unit includes:
a first conductor extending along the power wirings;
a second conductor extending along the power wirings and arranged farther from the group of power wirings than the first conductor;
a first connection wiring coupling the first and second conductors within the same coil unit; and
a second connection wiring coupling the first and second conductors between adjacent coil units in the circumferential direction, wherein
the first conductor, the second conductor, the first connection wiring, and second connection wiring are embedded in the heat-resistant substrate, wherein
at least the first conductor and the second conductor are not exposed outside of the heat-resistant substrate, and wherein
the respective first conductors are spaced by a substantially same minimum distance from an outer circumferential line surrounding the group of power wirings in a plane orthogonal to the extending direction of the group of power wirings, the outer circumferential line being defined by continuously arranged tangential lines in the circumferential direction each tangential line being in contact with outer circumferences of the power wirings adjacent in the circumferential direction.

2. The heat-resistant device according to claim 1, further comprising at least one terminal wiring coupled to at least one of the first conductor, the second conductor, the first connection wiring, and the second connection wiring.

3. The heat-resistant device according to claim 1, wherein the ceramic material includes at least one of alumina, silica, zirconia, titania, magnesia, and cordierite.

4. The heat-resistant device according to claim 1, wherein the heat-resistant substrate includes a glass material.

5. The heat-resistant device according to claim 1, wherein the power wirings and the coil structure include a same metal material.

6. The heat-resistant device according to claim 1, wherein the power wirings and the coil structure include a copper.

7. The heat-resistant device according to claim 1, wherein the adjacent coil units in the circumferential direction are coupled via at least one intermediate coil unit that is smaller in size than the coil unit.

8. The heat-resistant device according to claim 7, wherein the at least one intermediate coil unit comprises:
a third conductor extending along the power wirings;
a fourth conductor arranged farther from the group of power wirings than the third conductor and extending along the power wirings;
a third connection wiring coupling third and fourth conductors; and
a fourth connection wiring coupling the third or fourth conductor to the first or second conductor.

9. The heat-resistant device according to claim 8, wherein the first to fourth conductors are arranged in a plane.

10. The heat-resistant device according to claim 1, further comprising a return wiring extending in the circumferential direction toward the start point from the end point of the coil wiring of the coil structure in such a manner that the return wiring passes through the coil units.

11. The heat-resistant device according to claim 1, wherein a portion of the heat resistant device surrounded by the outer circumferential line is a solid portion consisting of the heat-resistant substrate and the power wirings.

12. The heat-resistant device according to claim 1, wherein the group of power wirings includes first power wirings and second power wirings, the second power wirings being arranged to surround the first power wirings.

* * * * *